United States Patent
Coley et al.

(10) Patent No.: US 6,876,241 B2
(45) Date of Patent: Apr. 5, 2005

(54) CIRCUIT FOR GENERATING FROM LOW VOLTAGE EDGES HIGHER VOLTAGE PULSES HAVING PRECISE AMPLITUDES AND DURATIONS

(75) Inventors: William H. Coley, Longmont, CO (US); Stephen B. Venzke, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/631,703

(22) Filed: Jul. 31, 2003

(65) Prior Publication Data

US 2005/0024119 A1 Feb. 3, 2005

(51) Int. Cl.[7] .................................................. H03K 3/00
(52) U.S. Cl. ...................................... 327/291; 327/112
(58) Field of Search ................................. 327/291, 294, 327/374–377, 309, 108–112; 326/29, 82–92

(56) References Cited

U.S. PATENT DOCUMENTS

| | | | |
|---|---|---|---|
| 3,160,766 A | * 12/1964 | Reymond | 327/375 |
| 3,751,682 A | * 8/1973 | Howe | 327/111 |
| 4,808,845 A | * 2/1989 | Suzuki et al. | 326/84 |
| 5,677,647 A | * 10/1997 | Knierim | 330/263 |

* cited by examiner

Primary Examiner—Minh Nguyen
(74) Attorney, Agent, or Firm—Edward L. Miller

(57) ABSTRACT

A low voltage source of input edges is AC coupled to positive and negative edge differentiators. Each differentiator briefly drives ON a corresponding normally OFF switch, the pair of which switches serves as an impulse driver and that may be clamped to symmetrical opposing reference voltages. The bi-stable switch driver responds to a particular polarity impulse driver voltage by applying thereto through a load resistor a percentage of a power supply voltage of opposite polarity. The impulse driver is also coupled to a complementary pair of MOSFET switches that are in series between precise reference voltages of opposing polarities, and whose common junction may be connected to a current determining resistance. The output of the MOSFET switches may be assisted by an auxiliary bi-stable output driver that reduces the amount of load current drawn from those MOSFETS.

11 Claims, 3 Drawing Sheets

THE BASIC ΔΣ ANALOG TO DIGITAL MEASUREMENT ARCHITECTURE

US 6,876,241 B2

CIRCUIT FOR GENERATING FROM LOW VOLTAGE EDGES HIGHER VOLTAGE PULSES HAVING PRECISE AMPLITUDES AND DURATIONS

BACKGROUND OF THE INVENTION

The use of pulses having precisely defined widths is common in many types of electronic circuits. Such pulses can be created with digital logic. It often happens that such a pulse is required to define more than just a width in time; for example, when it is applied to an integrator that is also responsive to the amplitude of that pulse. A common instance of this is when a pulse of precision width and voltage drives an integrator input resistor. Such precision current pulses must have not only a precise duration, but also a precise amplitude, since the total amount of charge applied to the integrator is (for an ideally shaped pulse) a product of the two. Precise current pulses are often used in conjunction with integrators in such applications as DACs (Digital to Analog Converters), which in turn may be used in the precision ADCs (Analog to Digital Converters) that are found in laboratory quality digital multi-meters.

Two trends in current practices have introduced a difficulty in the design of a precision pulsed current source. The first is the trend to place ever more circuitry onto a single IC (Integrated Circuit). While this has many advantages in some respects, it does limit what mix of semiconductor processes is available, and places a premium of keeping power dissipation to a minimum. A second trend in response to the first is that the industry has developed low voltage high speed logic families that operate on 5V or less. It is possible to generate high speed precisely placed pulse edges with these low voltage logic families, but when converted to current pulses the low voltages involved give rise to undesirable reductions in signal to noise ratios. Very often, the designer would prefer to have a much higher voltage to work with, but is compelled to either use the low voltage associated with the newer logic family and suffer the loss in precision, or use an older (and perhaps less available) process with a higher voltage. A third option is to use a modern low voltage high speed logic family for pulse-edge generation, and then apply that to a switching mechanism to shift its level to a suitably high voltage obtained from a stable reference voltage. A number of challenges arise when this latter approach is used in a system that is expected to be extremely accurate, and just how to do it is a significant problem in its own right.

SUMMARY OF THE INVENTION

A low voltage source of input edges for a current pulse of precision amplitude and duration is applied to an input buffer to provide a low impedance source whose output is AC coupled to a positive edge differentiator and also to a negative edge differentiator. Each differentiator briefly drives ON a corresponding normally OFF switch, the pair of which switches are in series between first power supplies of opposite polarity, and whose junction serves as an impulse driver and that may be clamped to symmetrical opposing reference voltages less than the voltages of the first power supplies. The clamped impulse driver may also be coupled to a bi-stable switch driver that responds to a positive impulse driver voltage by applying thereto through a coupling resistor a percentage of the negative first power supply voltage. The bi-stable switch driver responds to a negative impulse driver voltage by applying thereto through the coupling resistor a percentage of the positive first power supply voltage. The bi-stable switch driver changes state each time input edges of alternating polarity are applied to the input buffer. The impulse driver is also coupled to the gates of a complementary pair of MOSFET switches that are in series between precise reference voltages of opposing polarities, and whose common junction may be connected to a current determining resistance whose other end is connected to a using circuit, such as an integrator. The output of the MOSFET switches may be assisted by an auxiliary bi-stable output driver that reduces the amount of load current drawn from those MOSFETs, and thereby reduces errors arising from thermally induced variations in their ON resistance. The precise reference voltages may be the same as the symmetrical opposing references.

DESCRIPTION OF A PREFERRED EMBODIMENT

Figure 1:
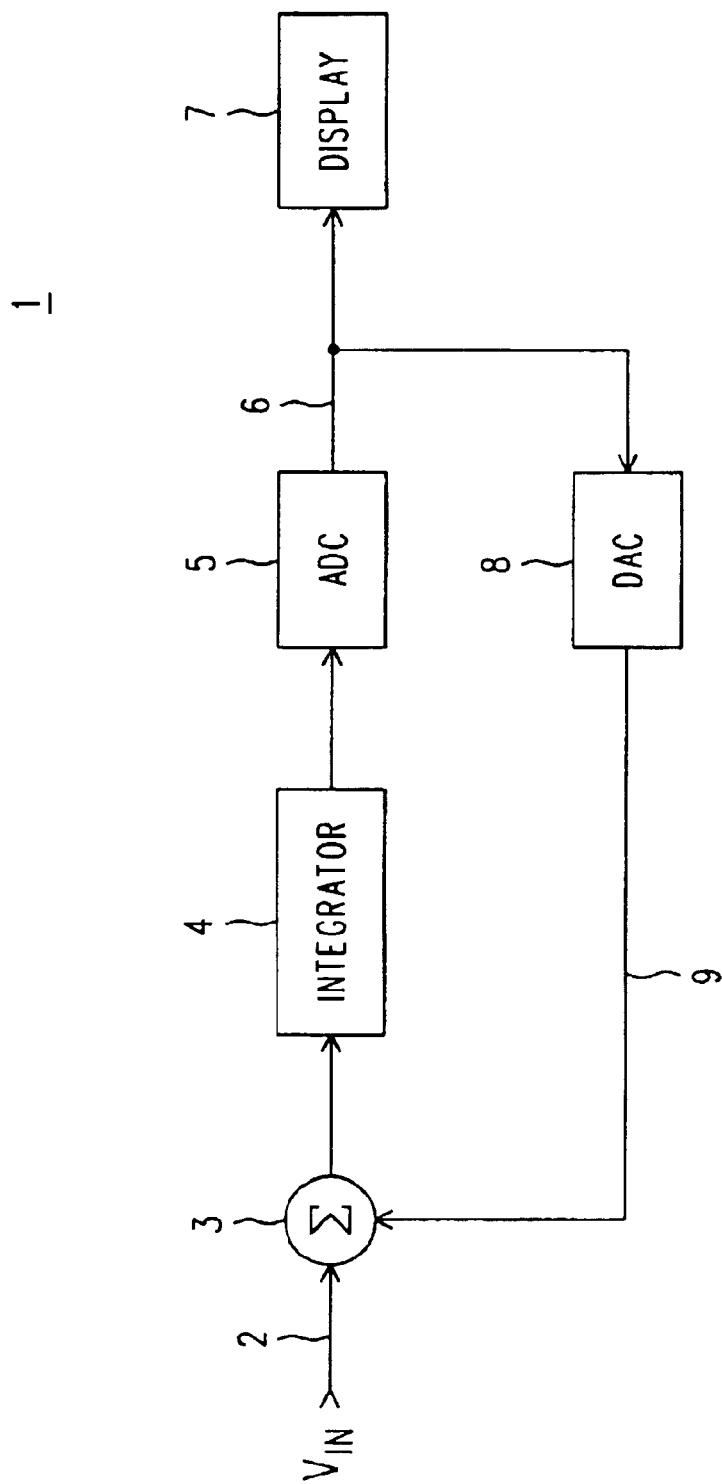
FIG. 1 is a simplified block diagram of a voltage measurement architecture that provides an occasion for practicing the invention.

Refer now to FIG. 1, wherein is shown a simplified block diagram representation 1 of a voltage measurement technique known as the $\Delta\Sigma$ architecture. We shall describe it briefly, as the subject matter we are interested in can be put to use in the $\Delta\Sigma$ architecture. The $\Delta\Sigma$ architecture itself may be used, for example, in digital multi-meters ranging from the mid-range of performance to equipment at the very top of the line (e.g., a multi-meter such as the Agilent 3458A).

A voltage $V_{IN}$ 2 to be measured is applied to the + input of a SUMMING JUNCTION 3, whose output is coupled to an INTEGRATOR 4. When, in the course of events, the measurement is concluded, a feed-back balancing voltage (9) will be developed whose average value is equal to minus $V_{IN}$. This is applied to the other input of the SUMMING JUNCTION 3, such that if this condition is maintained for a suitable period of time, the output of the SUMMING JUNCTION will be zero, and the output of the INTEGRATOR will effectively cease changing. The output of the INTEGRATOR is applied to an ADC, and is a digital representation of $V_{IN}$ (again, assuming that balance has been achieved). That digital representation is applied to an output display mechanism (or perhaps put to some other use), and it is also applied to a DAC from which issues the feed back balancing voltage 9. This has been a very simplified look at the $\Delta\Sigma$ architecture, and we have ignored many topics important to an actual full scale implementation, such as input amplifiers and attenuators. Nevertheless, it will serve out purpose here.

Our interest in FIG. 1 is in what goes on inside the DAC 8. It receives a collection of digital values, probably of many bits representing, say, four to eight decimal digits. It needs to turn that back into an analog voltage within some range, say, −7V . . . +7V. Let us assume that, as is often done, the binary representation from the ADC 6 has been used to create pulses whose widths are precisely defined by low voltage edges of perhaps, three to five volts. These pulse width modulated input signals are too small to create average values up to seven volts that will cancel the applied input at the SUMMING JUNCTION. If we used the smaller amplitude pulse width modulated signals (say, 3–5V) directly, we would have to scale $V_{IN}$ down in amplitude, and would incur an increased signal to noise ratio during operation. Thus, we are compelled to "stretch" the low voltage pulse width modulated signals vertically (in voltage) in order to proceed. How to do that is the subject matter of FIGS. 2 and 3.

Figure 2:
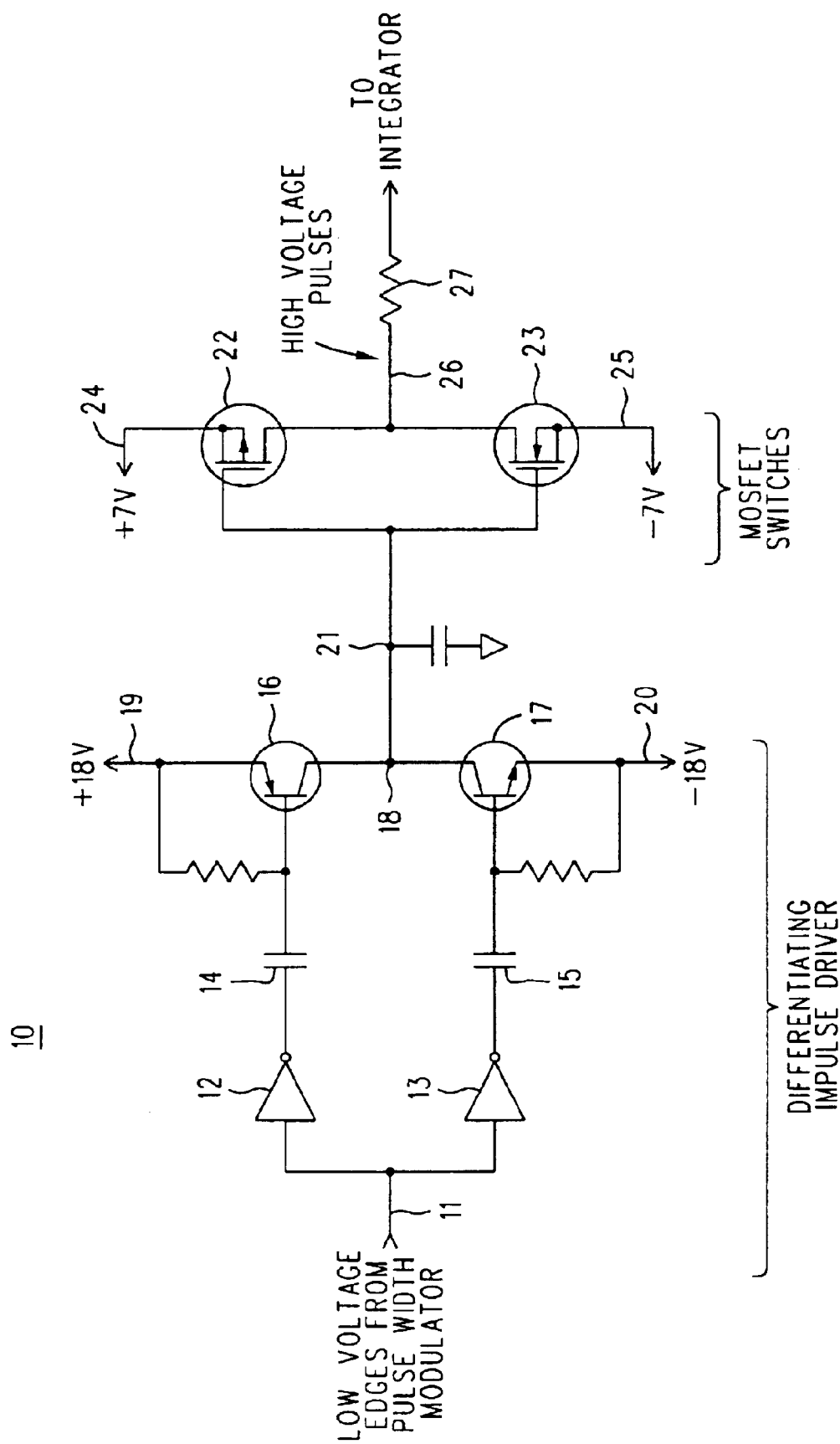
FIG. 2 is a simplified schematic portion of the DAC mechanism in FIG. 1, wherein current pulses are generated from the low voltage edges of a pulse width modulated signal.

Refer now to FIG. 2, wherein is shown a simplified schematic diagram 10 of a basic circuit for creating precision pulses from the edges of low-voltage pulse width modulated signals 11. The low voltage edges 11 are applied to a DIFFERENTIATING IMPULSE DRIVER circuit that has two portions, one for each polarity transition in the low voltage edges 11. Buffer 12, capacitor 14 and transistor 16 respond to negative transitions, while buffer 13, capacitor 15 and transistor 17 respond to positive transitions. Between transitions the transistors 16 and 17 are both normally OFF. Consider a positive transition in the low voltage edges. Both capacitors will differentiate it, but only transistor 17 will respond, by turning ON very briefly, producing a negative impulse derived from the negative power supply 20. The time constants are chosen so that the ON time is in the range of 2% to 5% of the maximum, or total, pulse width period. In a similar fashion, a negative transition will briefly turn transistor 16 ON, producing a positive impulse derived from the positive power supply 19.

An advantage of the arrangement shown for transistors 16 and 17 is they are mostly OFF, which is desirable for reduced power consumption and heating related behavior changes. In addition, it will be appreciated that their ON time is a function of just time constants, and NOT a function of pulse width. If their ON times were a function of input pulse width, then an avenue for undesirable non-linear operation is opened.

When transistor 17 turns ON, a brief negative spike, or voltage impulse, appears at node 18 and is applied to, and charges, capacitor 21. This negative voltage will turn MOSFET switch 22 ON, while turning MOSFET switch 23 OFF. Thus, a positive transition in the low voltage edges 11 will result in the positive power supply voltage 24 being the source for an output pulse on output line 26 that is applied to resistor 27 (to make it a current pulse for an integrator that is not shown). The positive voltage at output 26 will remain until a subsequent negative transition in the low voltage edges 11 produces a positive impulse from transistor 16 that discharges capacitor 21 from its previous negative value and charges it to the new positive one. That causes MOSFET switch 23 to turn ON, and MOSFET switch 22 to turn OFF. The result is that the pulse output line 26 is pulled to the value of power supply voltage 25. Capacitor 21 may be a discrete part, or be the gate capacitances of the MOSFETs 22 and 23, or a combination of both.

It will be noted that when a steady sequence of alternating polarity low voltage edges 11 is applied, the two MOSFET switches 22 and 23 do not operate in a true tri-state fashion; save for what might occur during transitions, one is always ON and the other is always OFF. This observation leaves un-addressed, however, the issue of whether the MOSFET SWITCHES driven by the DIFFERENTIATING IMPULSE DRIVER operate in make-before-break fashion or break-before-make fashion. Either may be obtained; what is shown operates as make-before-break. To obtain break-before-make it is merely necessary to interchange the two MOSFET switches (note that they are a complementary pair, in that they have channels of opposite polarities). An advantage of the make-before-break arrangement is that is produces a lower ON resistance for the MOSFETs 22 and 23.

Figure 3:
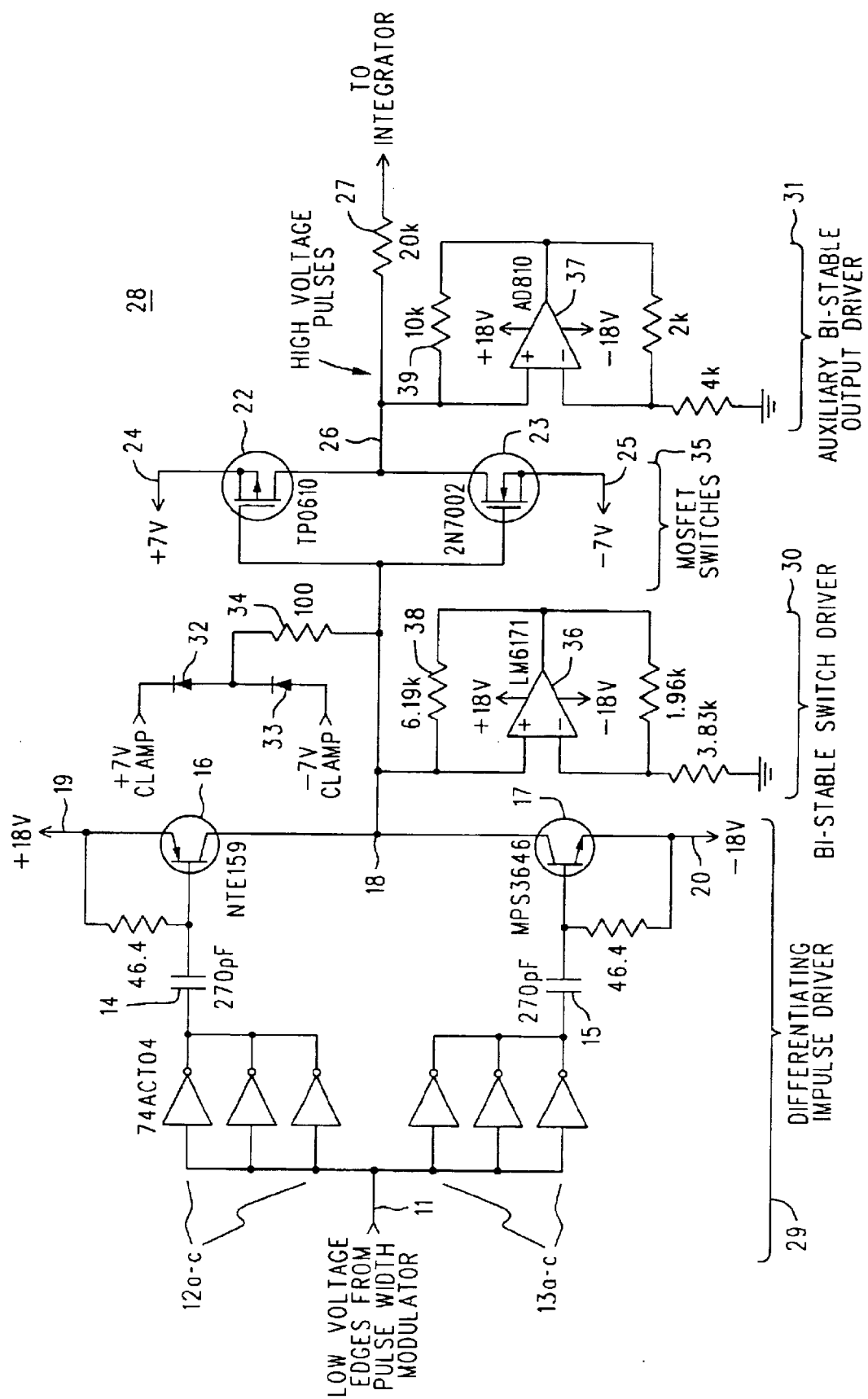
FIG. 3 is a schematic portion of the DAC mechanism in FIG. 1, and includes further improvements for greater accuracy and linearity.

Refer now to FIG. 3, which is a more detailed schematic 28 for a more sophisticated application of the basic technique set out in FIG. 2. We have kept the reference numerals the same in locations where the parts are in good correspondence, and have added new ones elsewhere. The basic operation of the circuit 28 is the same, so we shall discuss only the incremental functionality provided by the additional components.

It will be noted that the input buffers for the DIFFERENTIATING IMPULSE DRIVER 29 have been made quite robust by operating several parts in parallel (12a–c and 13a–c). This is in keeping with the speeds being reasonably high and the impedance to be driven being fairly low. For example, in one embodiment the range of pulse widths is 300 ns to 1,700 ns, with rise times in the low nanoseconds and a 500 KHz repetition rate.

The next topic of interest is the addition of the BI-STABLE SWITCH DRIVER 30. First, it is connected between ground and the junction node 18 of the two transistors 16 and 17 of the IMPULSE DRIVER 29. Capacitor 21 is now absent, save for what unavoidable strays and device capacitances (for transistors 22 and 23) remain. In fact, rather than have a capacitance there to act as a voltage storage mechanism, we now prefer that there be as little capacitance from node 18 to ground as possible. But something has to perform the "store-and-hold" function that allows transient impulses from the IMPULSE DRIVER 29 to cause a steady pulse output from the MOSFET SWITCHES 22 and 23. That something is the BI-STABLE SWITCH DRIVER 30, which is an active network built around amplifier 36. In addition, the voltage swing at node 18 has been clamped through resistor 34 (a save-the-diodes current limit) by diode 32 to a +7V CLAMP voltage, and by diode 33 to a −7V CLAMP voltage.

What the BI-STABLE SWITCH DRIVER 30 does is drive node 18 with a positive or negative voltage that is larger than the plus and minus 7V CLAMP voltages, respectively. The BI-STABLE SWITCH DRIVER is triggered, or switched, from one state or the other by an impulse of the corresponding polarity from the IMPULSE DRIVER 29. It then drives node 18 (i.e., one of the clamp diodes 32 and 33) through resistor 38, which then maintains a steady drive to the MOSFET SWITCHES 35 until the next transition in the LOW VOLTAGE EDGES 11.

Another way to think of the BI-STABLE SWITCH DRIVER 30 is as a voltage driven current source. It "follows" the brief but powerful transient provided by the IMPULSE DRIVER, and once perturbed has a source voltage higher than the associated CLAMP voltage. The clamping action wins, however, and the clamped voltage substitutes for the now absent transient impulse drive. But the voltage responsive current source behavior remains, now in response to the clamping of its own output. The action is rather like a latch.

The reason for the 100 Ω resistor 34 is also now apparent: it is large enough to keep the rather gutsy transient from the IMPULSE DRIVER from frying the diodes 32 and 33 and glitching the associated power supplies, yet small enough to not interfere with the clamping action.

The clamping action is important for error reduction, for the following reason. If the drive to the MOSFET SWITCHES 35 was not clamped, then it would in all likelihood exhibit droop or other non-constant behavior between transitions. The amount of droop will be a function of how long it is allowed to occur, which is to say, it will be a function of pulse duration. This is bad, because when a transition does occur after there has been some droop (or other drift), the further excursion in voltage needed to reach the threshold for switching the MOSFETs will be different from one instance to the next, according to the amount of droop. Since the slewing rates are finite, that translates into a pulse width dependent timing error in edge placement for the output pulse. Clamping fixes things so that any such effect of slewing rate/excursion to the threshold is constant for all pulses, which in essence, cancels the effect.

Another element that has been added to FIG. 3 is the AUXILIARY BI-STABLE OUTPUT DRIVER 31. It is another bi-stable voltage driven current source, built around amplifier 37 and coupled to a node (in this case line 26) through resistor 39. That is, when MOSFET 22 is ON, a positive voltage (and its current) is supplied by AUXILIARY BI-STABLE OUTPUT DRIVER 31, which is essentially an additional source in parallel with MOSFET 22. A similar negative voltage (and its current) is supplied when MOSFET 23 is ON, instead. When one of the MOSFET SWITCHES is ON, (producing a known ±7V) the associated output voltage would source or sink a particular current through resistor 27 (its other end being a virtual ground provided by the integrator). The component values chosen for the AUXILIARY BI-STABLE OUTPUT DRIVER 31 are such that IT supplies almost all of that current, leaving only a very little to be supplied by the MOSFET SWITCHES themselves. The reason for having the AUXILIARY BI-STABLE OUTPUT DRIVER 31 is as follows.

The MOSFETs 22 and 23 each have an ON resistance of about 10 Ω. It would not be so bad if that value were constant, but it unfortunately varies as a function of temperature, and produces performance variations that are detectable. By providing the extra drive from the AUXILIARY BI-STABLE OUTPUT DRIVER 31 (most of the current through the integrator load resistor 27 actually is due to sourcing and sinking by the AUXILIARY BI-STABLE OUTPUT DRIVER) those temperature induced variations are swamped out. That is, the voltage drop across that temperature variable ON resistance is made very low, since almost no current flows through it.

The circuit 28 shown in FIG. 3 is capable of precision operation. The error in edge placement for the output pulses, relative to the input edges, can, with reasonable care, be made to be on the order of ²⁄₁₀ ppm. For the integrated output to have that kind of accuracy, appropriate care must be exercised with the various reference and supply voltages, as well as with component selection generally. And although there may be many combinations of passive component values and choices for active devices, in the interest of complete disclosure we have included in FIG. 3 actual component values and device specifiers for an embodiment that meets the ²⁄₁₀ ppm performance specification.

Lastly, we note that in some applications it may be desirable for the pulse generation circuits shown to operate in an unbalanced configuration, say, between ground and a thirty-six volt supply. This may be readily accomplished an appropriate shift in the various other voltages. Also, it will be discovered by those who try it that the generation of pulses of much higher voltage is possible, too.

We claim:

1. A method of producing pulses from a sequence of input signal edges that alternate in polarity, the method comprising the steps of:

(a) differentiating the transitions of the input signal edges;

(b) amplifying the differentiated transition of step (a);

(c) generating in response to the amplified transitions of step (b) a current whose polarity is determined by the polarity of the amplified transition to which it is in response;

(d) coupling the current of step (c) into a node;

(e) clamping the voltage at the node of step (d) to positive and negative values;

(f) driving a load to a positive power supply voltage with a switched ON first FET when the node of step (d) is clamped to a first polarity;

(e) driving the load to a negative power supply voltage with a switched ON second FET when the node of step (d) is clamped to a second polarity; and (f) one of the first and second FETs being an N-type FET and the other being a P-type FET.

2. A method as in claim 1 wherein the first and second FETs are in series and the polarities of the FETs are chosen to create make-before-break operation.

3. A method as in claim 1 wherein the first and second FETs are in series and the polarities of the FETs are chosen to create break-before-make operation.

4. A method as in claim 1 wherein the load is a resistor coupled to the input of an integrator and further comprising the step of integrating current pulses formed by the switching of the first and second FETs.

5. A method as in claim 1 further comprising the step of generating, in response to the voltage driving the load, a selected current of corresponding polarity that is coupled to the load and that supplies the majority of the current through the load.

6. Pulse production apparatus comprising:

an impulse driver having an input for receiving a sequence of input signal edges that alternate in polarity, that differentiates the input signal edges into positive and negative impulse transients, and that separately amplifies each such transient and presents the amplifications at a common output of the impulse driver;

a voltage clamping circuit having an input and that limits positive and negative voltages at that input to selected amounts;

a voltage controlled current source having an input coupled to the common output of the impulse driver and supplying current of a selected amount and polarity to the input of the voltage clamping circuit;

a complementary pair of FET switches in series with each other, the complementary pair in parallel with a supply voltage source, and the gates of the complementary pair of FET switches each being connected to the input of the voltage clamping circuit; and the junction of the pair of FET switches in series being a pulse output coupled to supply an output pulse.

7. Apparatus as in claim 6 wherein the order of the complementary pair of FET switches as they are in parallel with the supply voltage source produces make-before-break operation.

8. Apparatus as in claim 6 wherein the order of the complementary pair of FET switches as they are in parallel with the supply voltage source produces break-before-make operation.

9. Apparatus as in claim 6 further comprising a integrator having an input and also further comprising an integrator input resistor coupled between the pulse output and the input of the integrator.

10. Apparatus as in claim 6 wherein the peak-to-peak voltage of the output pulse is greater than the peak-to-peak voltage of the input signal edges that alternate in polarity.

11. Apparatus as in claim 6 further comprising a load coupled to the pulse output and also further comprising another voltage controlled current source, having an input coupled to the pulse output, that generates a current of selected size and polarity that is coupled to the load, and that supplies the majority of the current for the load.

* * * * *

UNITED STATES PATENT AND TRADEMARK OFFICE
CERTIFICATE OF CORRECTION

PATENT NO. : 6,876,241 B2  Page 1 of 1
APPLICATION NO. : 10/631703
DATED : April 5, 2005
INVENTOR(S) : Coley et al.

It is certified that error appears in the above-identified patent and that said Letters Patent is hereby corrected as shown below:

In column 6, line 4, in Claim 1, delete "(e)" and insert -- (g) --, therefor.

In column 6, line 7, in Claim 1, delete "(f)" and insert -- (h) --, therefor.

Signed and Sealed this

Fourteenth Day of November, 2006

JON W. DUDAS
*Director of the United States Patent and Trademark Office*